United States Patent [19]
Bianu et al.

[11] Patent Number: 5,656,978
[45] Date of Patent: Aug. 12, 1997

[54] CONTROL CIRCUIT AND METHOD FOR DIRECT CURRENT CONTROLLED ATTENUATOR

[75] Inventors: Daniel Bianu, Mountain View; Charles H. Gall, Newark, both of Calif.

[73] Assignee: Harmonic Lightwaves, Sunnyvale, Calif.

[21] Appl. No.: 570,444

[22] Filed: Dec. 11, 1995

[51] Int. Cl.$^6$ ................................................ H03H 7/24
[52] U.S. Cl. ................................. 333/81 R; 333/81 A
[58] Field of Search .......................... 333/81 R, 81 A; 327/308

[56] References Cited

U.S. PATENT DOCUMENTS

| | | | |
|---|---|---|---|
| 3,289,120 | 11/1966 | Anders et al. | 333/81 R |
| 3,529,266 | 9/1970 | King | 333/81 R |
| 3,663,900 | 5/1972 | Peterson | 333/81 R |
| 3,921,106 | 11/1975 | Williams | 333/81 R |
| 4,236,126 | 11/1980 | Weller et al. | 333/81 R |

FOREIGN PATENT DOCUMENTS

| | | | |
|---|---|---|---|
| 2122528 | 11/1972 | Germany | 333/81 R |
| 42959 | 4/1979 | Japan | 333/81 R |
| 268467 | 9/1994 | Japan | 333/81 R |

*Primary Examiner*—Paul Gensler
*Attorney, Agent, or Firm*—Skjerven, Morrill, MacPherson, Franklin & Friel; Norman R. Klivans

[57] ABSTRACT

A bridge T attenuator which includes PIN diodes in both the bridge arm and in the shunt arm, and in which the current through the shunt arm is controlled with respect to the current through the bridge arm, so that the product of these two currents equals a constant. This is accomplished by a feedback loop. Thus a relatively simple, inexpensive, and entirely analog solution is provided for a bridge T attenuator to be used with a radio frequency signal, so that a prescribed level of attenuation set by a user may be maintained while the impedance is maintained at a fixed value over the entire attenuation range.

13 Claims, 3 Drawing Sheets

CONTROL CIRCUIT AND METHOD FOR DIRECT CURRENT CONTROLLED ATTENUATOR

BACKGROUND OF THE INVENTION

1. Field of the Invention

This invention relates to a control circuit for a variable bridge T attenuator.

2. Description of the Prior Art

A bridge T fixed value attenuator of the type shown in FIG. 1A is well known. An input signal is applied to the Port 1 terminal; an output signal is provided at the Port 2 terminal. The attenuator of FIG. 1A has a main arm which includes two resistors R1 and R2. The node between resistors R1 and R2 is connected to ground via shunt resistor R3. The upper (bridge) arm includes resistor R4. To achieve a prescribed level of attenuation while maintaining a predetermined input and output impedance R0, resistors R1 and R2 are fixed at a value of R0 while the values of resistors R3 and R4 are varied so that $R3*R4=R_0^2$.

One method for controlling a prior art bridge T attenuator is to use a dual potentiometer connected as in FIG. 1B where resistances R3 and R4 are each potentiometers. However this use of potentiometers has been found to be inferior, because it does not lend itself to high frequencies. Replacing resistors R3 and R4 with pin diodes creates an electrically variable attenuator which has superior frequency response but now needs an electrical drive provided by a simple potentiometer to maintain the equality $R3*R4=R_0^2$.

A second approach is to use a combination of a microprocessor (or microcontroller) and a lookup table stored in a memory to control the bridge T attenuator. For various degrees of attenuation, different resistance values are stored in the lookup table. When the user selects a particular level of attenuation, the microprocessor accesses the lookup table, determines the corresponding amount of resistance, and then adjusts it accordingly. Such digital control of attenuation is effective but requires relatively expensive components, i.e. at least a microcontroller and a memory.

Thus there is not available a bridge T attenuator control circuit or method which is satisfactory in terms of functionality by providing a prescribed level of attenuation for all values of attenuation while maintaining all terminal impedances constant and equal to the characteristic impedance of the system and which is also relatively inexpensive and simple.

SUMMARY

An electronic circuit controls a variable bridge T attenuator such that the terminal impedances remain constant, and equal to the characteristic impedance of the system, for all values of attenuation. This control circuit causes the resistance of the PIN diodes in the attenuator to follow the ideal relationship between the element values with no approximation such that (for FIG. 1A) $R3 \times R4=R_0^2$. Feedback in the control circuit forces the product of the currents through the PIN diodes to be constant and equal to the square of a reference current. The product of the currents is derived by the summation of voltages across the PIN diodes of the attenuator.

The control circuit includes an independent current source, a controlled current source and PIN diodes. The independent current source establishes the attenuation. The controlled current source is driven by an integrator which in turn is driven by the error between the sum of the attenuator PIN diode voltages and a fixed reference. Thus a circuit containing a multiplier in the feedback loop of an operational amplifier maintains the product of currents through the PIN diodes to be constant and equal to the square of a reference current.

Thus a bridge T attenuator in accordance with the invention, instead of using a resistor in the bridge arm, uses a diode. Similarly the shunt resistor is replaced by a second diode. For control purposes, a master (independent) current source provides current to drive the bridge arm and the main arm, while a slave (controlled) current source provides current to the shunt diode. The product of the currents from the master current source and the slave current source are kept constant in order to have good return loss. In one embodiment, the product of the two currents is kept constant by measuring the master current and adjusting the slave current by means of a divider circuit containing a multiplier in a feedback loop of an operational amplifier. In another embodiment, instead of using a multiplier, one adds a logarithm of the level of the current from the master current source to the logarithm level of the current from the slave current source, and by feedback maintains the sum of the two logarithms at a constant value.

The diodes are e.g. PIN diodes. This is a type of diode having a resistance inversely proportional to the current flowing through the diode. Thus the resistance of the bridge arm and the shunt arm are variable in accordance with the current supplied thereto. The level of attenuation is user controlled by varying the level of the current provided by the master current source, for instance by use of a potentiometer. In one embodiment the feedback loop is temperature compensated by inclusion of an additional PIN diode providing the reference voltage.

DETAILED DESCRIPTION

The electrical rules governing the operation of bridge T attenuators are well known. The following describes these with respect to the prior art bridge T attenuator of FIG. 1A and are applicable to the bridge T attenuator in accordance with the present invention as described below. If K is the ratio between the input and output current and Z is a characteristic impedance, then the formulas describing the bridge T attenuator are as follows (where the reference number for each component in these equations represents the component value):

$R1=R2=Z$ $R4=Z(K-1)$ $R3=Z/(K-1)$ $R3*R4=Z^2$ $R4/R3=(K-1)^2$

Figure 1A:
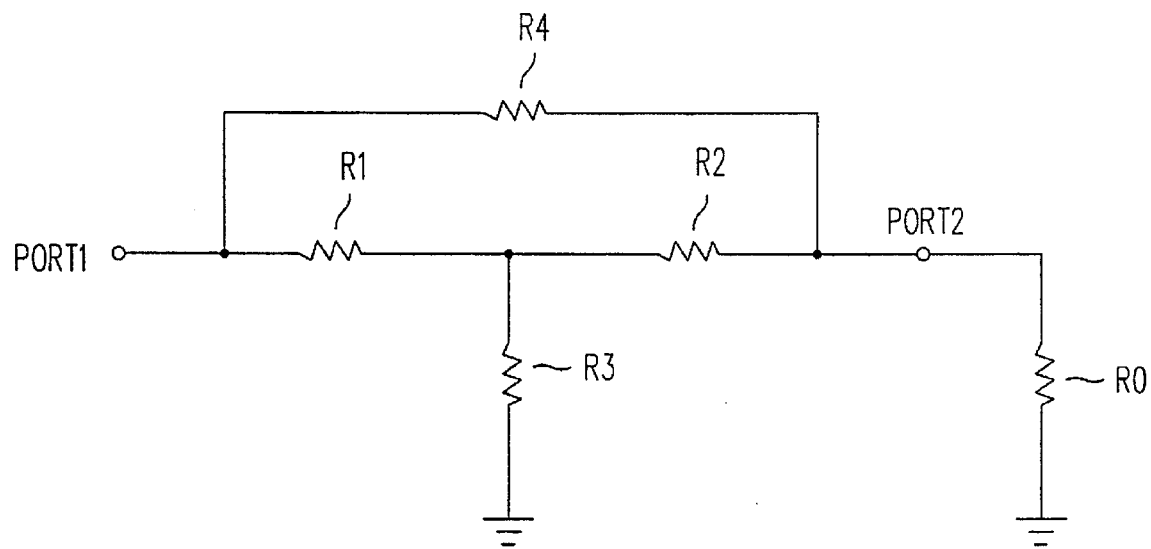
FIG. 1A shows a prior art bridge T attenuator.
Figure 1B:
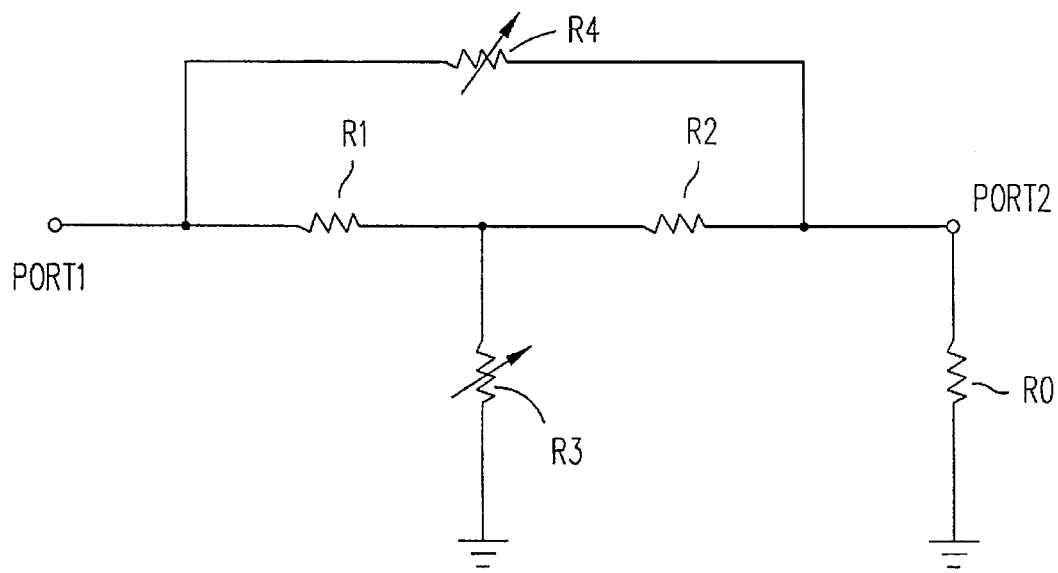
FIG. 1B shows a second prior art bridge T attenuator.

It is known that it is possible to substitute a diode (for instance a PIN diode) for certain of the resistors (i.e.

resistors R4 and R3) of FIG. 1A. As is well known, a PIN diode is a component having a resistance proportional to the inverse of the current passing through the diode. PIN diodes are commercially available.

A PIN diode includes a P-N junction with a doping profile tailored so that an intrinsic layer, the "I region", is sandwiched between a P (positively doped) layer and an N (negatively doped) layer. While certain commercially available diodes are designated PIN diodes, the use of this term herein is not intended to be limited to such commercially available products, but is intended to include any component having the desired current-resistance characteristics and also includes a multi-component circuit having more than one component which provides the desired characteristics.

Also, as is well known, a PIN diode at radio frequencies acts as a current controlled resistor and a PIN diode will propagate signals over a wide range of frequencies.

Figure 2:
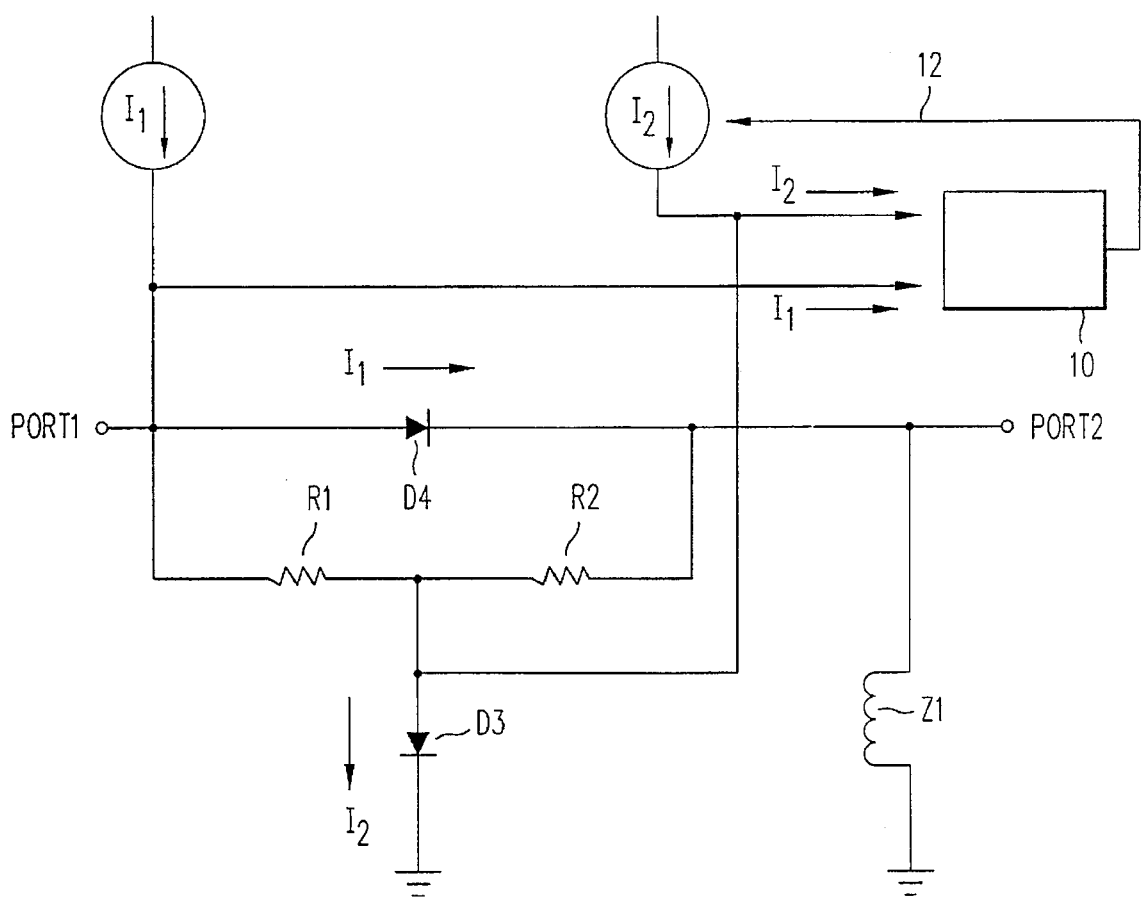
FIG. 2 shows a bridge T attenuator with a control circuit in accordance with the present invention.

Thus as shown in the left hand portion of FIG. 2, one substitutes for the bridge arm resistor R4 in FIG. 1A a first PIN diode D4, and similarly substitutes for the shunt resistor R3 in FIG. 1A a second PIN diode D3. These diodes are then biased by respectively currents $I_1$ and $I_2$ which are depicted in FIG. 2 as being provided by conventional current sources also labelled $I_1$ and $I_2$. Then applying the above equations relating to a bridge T attenuator to the circuit of FIG. 2, $R_{D3}$ (the resistance through diode D3)=$a/I_2$ and $R_{D4}$ (the resistance through diode D4)=$a/I_1$, wherein a is the proportionality constant of the PIN diode.

Then by algebra, $R_{D4}*R_{D3}=a^2/(I_1*I_2)=Z^2$ and hence $I_1*I_2=a^2/Z^2$= constant.

Therefore in order to have a good return loss, i.e. a properly functioning bridge T attenuator, the product of currents $I_1$ and $I_2$ is maintained constant in accordance with the present invention.

This is performed in the circuit of FIG. 2 by a control circuit shown in the right hand portion of FIG. 2 including a feedback control element 10 which is connected to the output terminals of current sources $I_1$ and $I_2$ and which maintains the product of current $I_1$ (the master) with the current $I_2$ (the slave) as a constant by controlling (in this case) the level of current $I_2$ by means of a feedback control line 12. One implementation of feedback control circuit 10 includes measuring the level of current $I_1$, and by means of a divider circuit containing a multiplier, maintaining the level of current $I_2$. The load Ro is not shown in FIG. 2, but is connected to Port2.

An alternative feedback control circuit 10, instead of using a multiplier circuit, takes the logarithms of each of currents $I_1$ and $L_2$, (or proportionate voltages V1, V2) adds them, and provides a feedback to current source $I_2$ to maintain the sum of the two logarithms at a constant value.

The other element shown in FIG. 2 is an inductor $Z_1$ which while not necessary has the advantage of providing a variable impedance, i.e. a high impedance at radio frequencies and a low impedance at low frequencies or direct current, for the purpose of biasing the diode.

The circuit of FIG. 2 operates by the user controlling (by means such as by a manual potentiometer adjustment) the current level provided by master current source $I_1$. Thus automatically the current level of slave current source $I_2$ is compensated to maintain the product of the two current levels as a constant, hence self-adjusting the bridge T attenuator. Advantageously the circuit of FIG. 2 can be implemented using all analog components (including for instance operational amplifiers) thus providing a reliable and inexpensive analog solution to control of a bridge T attenuator. Thus this control circuit can be easily integrated into another analog circuit without any need for digital-type components such as memory or a microprocessor.

The circuit of FIG. 2 is intended to illustrate the functionality of a control circuit in accordance with the present invention. Many different circuits in terms of actual components may be implemented which are equivalent to and perform the functions of FIG. 2, and all such circuits are intended to fall within the scope of the present invention.

Figure 3:
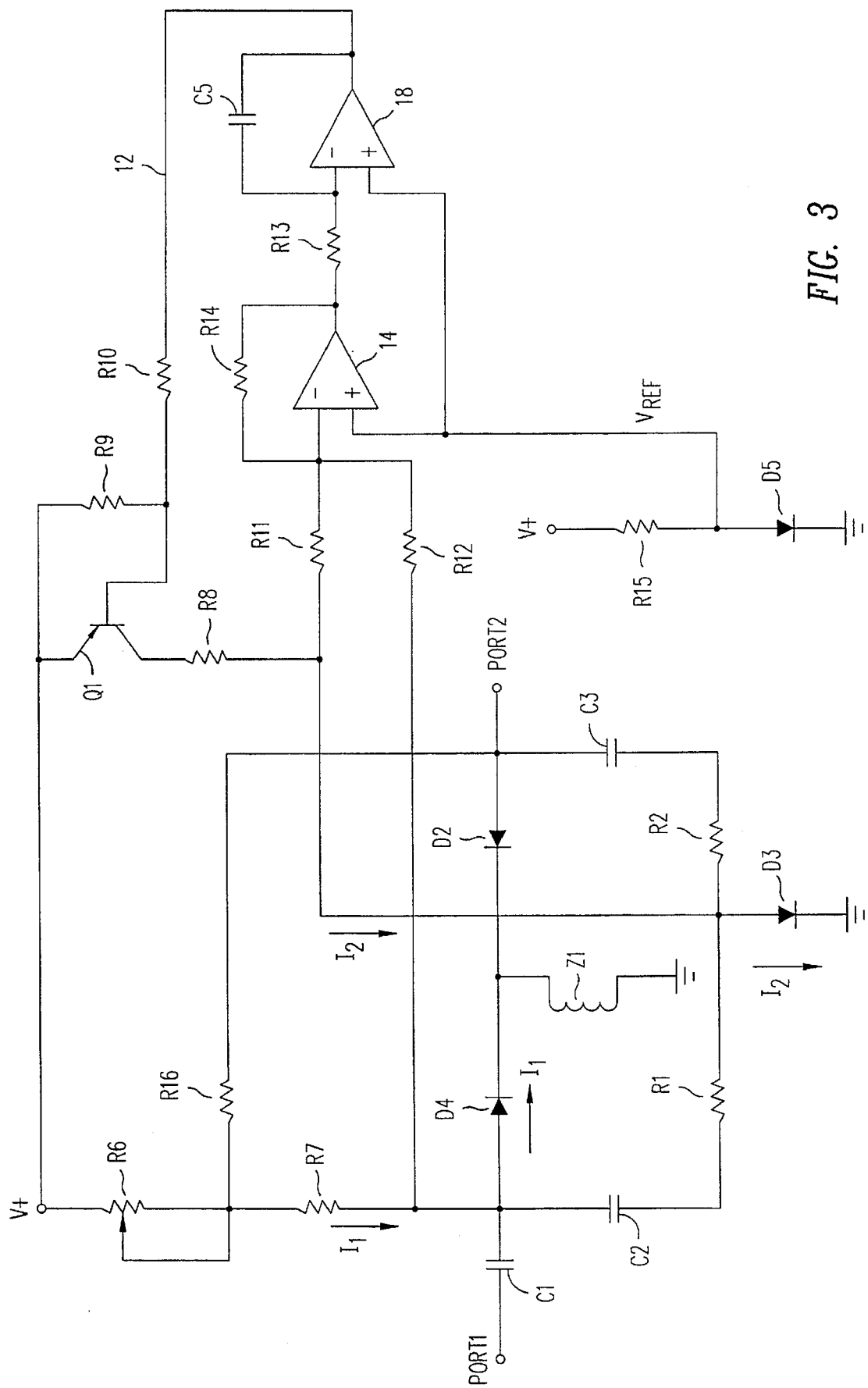
FIG. 3 shows a detailed schematic of one version of the bridge T attenuator and control circuit as shown in FIG. 2.

An example of one particular embodiment of a circuit of FIG. 2 is depicted in FIG. 3. Similar components in FIG. 3 have the same reference numbers as in FIG. 2. In FIG. 3 it can be seen that instead of just the single diode D4 in the upper arm, a second diode D2 is connected in series with diode D4. Use of two pin diodes D2 and D4 in the upper bridge arm of the bridge T attenuator advantageously serves to cancel distortion.

The master current source in FIG. 3 (corresponding to current source $I_1$ in FIG. 2), includes a voltage source V+ which is series-connected to a variable resistor (potentiometer) R6 and a bias fixed resistor R7. Adjustment of potentiometer R6 allows DC variance of the attenuation of this bridge T attenuator. Other components include capacitors C1, C2, and C3 for filtering. The values of components R6, R7, C1, C2, and C3 are not critical; the value of component R16 is equal to that of component R7.

The second current source in FIG. 3 (corresponding to current source $I_2$ in FIG. 2) is the transistor Q1 and associated resistors R8, R9, and R10. These in turn are driven by a feedback circuit (corresponding to element 10 of FIG. 2) which includes two operational amplifiers 14 and 18. In this embodiment, the first operational amplifier 14 is a summer and the second operational amplifier 18 is an integrator. These may be operational amplifiers of the type commercially available, or equivalent elements performing respectively the functions of summing and integrating. Resistors R11 and R12 are matched and each connected to the summing (inverting) input terminal of operational amplifier 14. The second (non-inverting) input terminal of operational amplifier 14 is connected to a voltage reference source $V_{REF}$ which as shown is provided by a resistor R15 connected to a voltage supply V+ and the other end of resistor R15 connected via a PIN diode D5 to ground. Diode D5 provides the desired temperature compensation for the reference voltage. Resistor R14 connects the output terminal of operational amplifier 14 to its inverting terminal, thus providing the summing function.

The output terminal of operational amplifier 14 is connected by a resistor R13 to the inverting input terminal of the second operational amplifier 18 which here functions as an integrator, due to capacitor C5 being connected between its output terminal and its inverting input terminal. The noninverting input terminal of operational amplifier 18 is connected to the reference voltage $V_{REF}$.

The output terminal of operational amplifier 18 (which is the integrator) is connected via feedback line 12 (also shown in FIG. 2) via resistor R10 to the base (control) terminal of transistor Q1 which is in the second current source. Hence, the current $I_2$ sourced by its current source including transistor Q1 and resistor R8 is controlled by a level of the voltage on the feedback line 12.

In this embodiment preferably each of pin diodes D2, D3, D4 and D5 are matched, i.e. have similar voltage/current characteristics. The value of inductor $Z_1$ varies with the desired frequency range. The attenuator of FIG. 3 has been found to provide satisfactory attenuation over a range of at least two dB to 25 dB.

The bridge T attenuator of FIG. 3 therefore is controlled by the addition of two logarithms, each logarithm representing a value of respectively currents $I_1$ and $I_2$. Thus by adding logarithms, one multiplies the two values of which the logarithms have been taken and hence obviates the need for an actual multiplier circuit per se. A theoretical explanation of this in terms of voltages and currents follows; however, understanding of this is not necessary for an appreciation of the operation of the present attenuator.

Let $V_1$ be the voltage drop across the combination of diodes D2 and D4 and let $V_2$ be the voltage drop across the shunt arm diode D3. Let $I_0$ be the reverse bias current of each of diodes D2, D3, and D4. Then:

$$V_1 = (KT/e)*\ln(I_1/I_0) \text{ and}$$

$$V_2 = (KT/e)*\ln(I_2/I_0).$$

K is the Boltzmann constant, T is temperature and e is electron charge. Therefore $V_1+V_2=(KT/e)*\ln(I_1*I_2/I_0^2)=a$ constant. The circuit of FIG. 3 makes the sum of $V_1$ and $V_2$ a constant and therefore makes the product of $I_1*I_2$ a constant using the feedback circuit. Thus in the circuit of FIG. 3 the value of $I_1$ is adjusted as a function of the required attenuation by tuning potentiometer R6, while the value of current $I_2$ is adjusted by the feedback loop.

Therefore $V_{OUT}=3*V_{REF}-V_1-V_2$ and $V_{OUT}=V_{REF}$ at the integrator input terminal (the noninverting terminal of operational amplifier 18) which gives $$V_1+V_2=2*V_{REF}.$$

Then replacing the corresponding currents for $V_1$ and $V_2$, this equation becomes:

$$2*(KT/e) \ln (I_{REF}/I_0) = (KT/e) \ln(I_1/I_0) + (KT/e) \ln(I_2/I_0),$$

which gives $$I_1*I_2 = I_{REF}^2.$$

Figure 4:
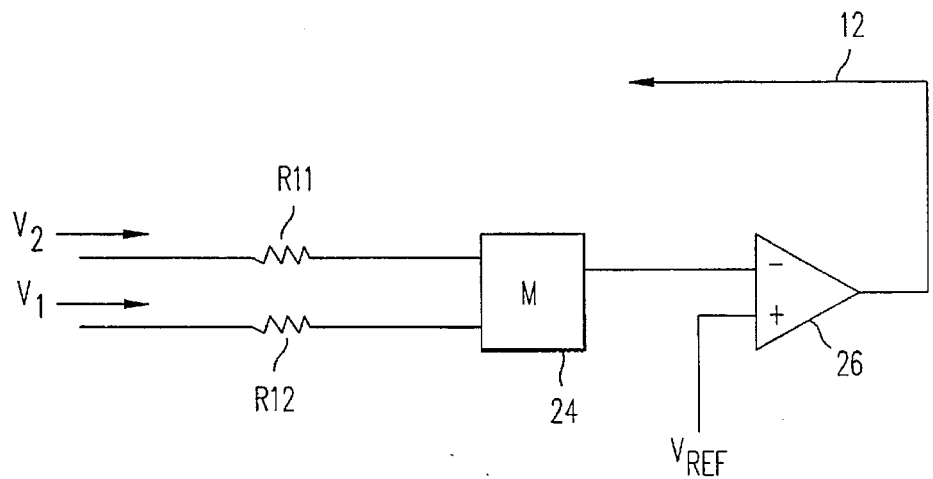
FIG. 4 shows a portion of the feedback circuit for a second embodiment of the control circuit of FIG. 2.

In accordance with a second embodiment of the invention as described above, instead of using a sum of the logarithms in the feedback circuit, a conceptually simpler (but in circuitry slightly more complex) solution as depicted in FIG. 4 is used for the feedback loop. In this case instead of using a summer and integrator, an e.g. commercially available multiplier circuit 24 receives voltage $V_1$ and $V_2$ and multiplies them together. This product, by means of comparator 26 which has its inverting terminal connected to the output terminal of multiplier 24 and its noninverting terminal connected to reference voltage $V_{REF}$, provides the feedback signal on feedback line 12. Thus the feedback circuit of FIG. 4 may be substituted in FIG. 3 for the elements 14 and 18 and the associated fixed components.

While in the presently illustrated embodiments the master current source is connected to the main arm and bridge arm of the attenuator and the slave current source to the shunt arm, these may be reversed.

This disclosure is illustrative and not limiting; further modifications will be apparent to one skilled in the art in light of this disclosure and are intended to fall within the scope of the appended claims.

We claim:

1. A bridge T attenuator, comprising:
    an input terminal;
    an output terminal;
    a first diode series-connected between the input and output terminal;
    first and second resistors series connected between the input and output terminals in parallel with the first diode;
    a second diode series-connected between a reference voltage and a node between the first and second resistors;
    a first current source connected to the input terminal; and
    a second current source connected to the node between the first and second resistors, wherein the second current source supplies a current level variable in response to a level of current supplied by the first current source, the second current source including:
        a variable current source having an output terminal which is the output terminal of the second current source and having a control terminal; and
        a feedback control circuit having an output terminal connected to the control terminal, and having two input terminals connected respectively to an output terminal of the first current source and the output terminal of the variable current source.

2. The attenuator of claim 1, wherein the first and second diode each are a type of diode having a resistance inversely proportional to a current through the diode.

3. The attenuator of claim 2, wherein the first and second diodes each are PIN diodes.

4. The attenuator of claim 1, further comprising a frequency variable impedance element connected between the reference voltage and the output terminal.

5. The attenuator of claim 4, wherein the impedance element is an inductor.

6. The attenuator of claim 1, wherein the first current source includes a potentiometer.

7. The attenuator of claim 1, further comprising a third diode series-connected between the first diode and the output terminal, wherein the third diode is connected to conduct current in an opposite direction than is the first diode.

8. The attenuator of claim 1, wherein the feedback control circuit includes:
    a summer having one input terminal connected to the two input terminals of the feedback control circuit and having an output terminal and a second input terminal connected to a reference voltage; and
    an integrator having two input terminals connected respectively to the output terminal of the summer and the reference voltage, and having an output terminal connected to the output terminal of the feedback control circuit.

9. The attenuator of claim 8, wherein the voltage reference includes a diode connected between ground and the second input terminals of the summer and the integrator.

10. The attenuator of claim 1, wherein the feedback control circuit includes:
    a multiplier having two input terminals connected respectively to the two input terminals of the feedback control circuit; and having an output terminal; and
    a comparator having two input terminals connected respectively to the output terminal of the multiplier and the reference voltage, and having an output terminal connected to the output terminal of the feedback control circuit.

11. The attenuator of claim 1, wherein a current of the second current source is inversely proportional to the current of the first current source.

12. A method of controlling attenuation of a high frequency signal, comprising, the steps of:

transmitting the signal along a first signal path including a first diode;

transmitting the signal along a second resistive signal path connected in parallel to the second signal path; wherein the second signal path is connected to a second diode series connected in shunt between the second signal path and ground; and maintaining a product of a current through the second diode and a current through the first signal path to be constant by the steps of:

feeding back the current through the second diode; and controlling the current through the second diode in response to the current through the first signal path.

13. A bridge T attenuator, comprising:

an input terminal;

an output terminal;

a first diode series-connected between the input and output terminal;

first and second resistors series connected between the input and output terminals in parallel with the first diode;

a second diode series-connected between a reference voltage and a node between the first and second resistors;

a first current source connected to the input terminal;

a second current source connected to the node between the first and second resistors, wherein the second current source supplies a current level variable in response to a level of current supplied by the first current source; and a third diode series-connected between the first diode and the output terminal but connected to conduct current in an opposite direction than the first diode.

* * * * *